United States Patent
Gao

(10) Patent No.: US 8,908,725 B2
(45) Date of Patent: *Dec. 9, 2014

(54) EXTERNAL CAVITY TUNABLE LASER

(71) Applicant: GP Photonics Inc., Tianjin (CN)

(72) Inventor: Peiliang Gao, Tianjin (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/974,674

(22) Filed: Aug. 23, 2013

(65) Prior Publication Data

US 2013/0343413 A1    Dec. 26, 2013

Related U.S. Application Data

(63) Continuation of application No. PCT/CN2011/075697, filed on Jun. 13, 2011.

(30) Foreign Application Priority Data

Jun. 2, 2011 (CN) .................. 2011 1 01469978

(51) Int. Cl.
| | | |
|---|---|---|
| *H01S 3/10* | (2006.01) | |
| *H01S 3/00* | (2006.01) | |
| *H01S 5/14* | (2006.01) | |
| H01S 5/028 | (2006.01) | |
| H01S 3/107 | (2006.01) | |
| H01S 3/106 | (2006.01) | |

(52) U.S. Cl.
CPC ............. *H01S 3/0085* (2013.01); *H01S 5/0287* (2013.01); *H01S 3/107* (2013.01); *H01S 5/142* (2013.01); *H01S 3/1068* (2013.01); *H01S 5/141* (2013.01)
USPC ............... 372/20; 372/13; 359/285; 359/286; 359/287; 359/305; 359/306; 359/307; 359/308; 359/309; 359/310; 359/311; 359/312; 359/313; 359/314

(58) Field of Classification Search
USPC ............... 372/13, 20; 359/285–287, 305–314
See application file for complete search history.

(56) References Cited

U.S. PATENT DOCUMENTS

| | | | |
|---|---|---|---|
| 5,511,086 A * | 4/1996 | Su .................................. | 372/31 |
| 6,535,542 B1 * | 3/2003 | Cao ................................ | 372/98 |
| 6,765,679 B2 * | 7/2004 | Ducellier et al. ............. | 356/491 |
| 6,845,121 B2 * | 1/2005 | McDonald ...................... | 372/34 |

(Continued)

FOREIGN PATENT DOCUMENTS

CN    101673921 A  *  3/2010   ................ H01S 5/32

*Primary Examiner* — Yuanda Zhang
(74) *Attorney, Agent, or Firm* — Flener IP Law

(57) ABSTRACT

The invention relates to an external cavity tunable laser. The laser comprises an extracavity collimating lens arranged outside a laser cavity, and a laser output mirror, a laser gain medium, an intracavity collimating lens, an active optical phase modulator and a tunable optical filter all arranged sequentially inside the laser cavity. The laser further comprises an active polarization rotator arranged behind the tunable optical filter, a polarization beam splitter arranged behind the active polarization rotator, a first etalon and a first total reflection mirror arranged in the direction vertical to the optic axis of a laser cavity output lens, a second etalon and a second total reflection mirror arranged in the direction of the optic axis of the laser cavity output lens, and a laser drive and control circuit. The invention is compact with high performance and low cost for volume production and easy installation, achieves high spectral density, narrow spectral bandwidth and tunable stable laser output within a wide spectrum range, and significantly reduces the difficulty in manufacturing the tunable optical filter and the etalons.

12 Claims, 5 Drawing Sheets

(56) References Cited

U.S. PATENT DOCUMENTS

| | | | |
|---|---|---|---|
| 7,027,472 B2 * | 4/2006 | Flanders | 372/26 |
| 7,372,612 B2 * | 5/2008 | Chu | 359/285 |
| 7,656,911 B2 * | 2/2010 | Mizutani et al. | 372/20 |
| 2003/0231688 A1 * | 12/2003 | Takabayashi | 372/92 |

* cited by examiner

EXTERNAL CAVITY TUNABLE LASER

CROSS-REFERENCE TO RELATED APPLICATION

The application is a continuation of PCT/CN2011/075697 (filed on Jun. 13, 2011), which claims priority of Chinese patent application 201110146997.8 (filed on Jun. 2, 2011), the contents of which are incorporated herein by reference, as if fully set forth herein.

FIELD OF THE INVENTION

The invention belongs to the field of photonics, and in particular relates to an external cavity tunable laser.

BACKGROUND OF THE INVENTION

Currently, most of the modern communication systems are based on fiber communication network, and fiber network has offered unprecedented huge capacity and installation flexibility and is able to support a variety of broadband applications that are under ceaseless development. Broadband and multi-channel tunable laser could help utilize the present fiber network redevices more efficiently. Data flow can be transferred from a congested channel to an unused channel by means of dynamic provision of broadband, thus Internet requirements are met. Use of a tunable laser makes rapid establishment or change of a light path easier, and it has become one of the important devices for implementing a dynamic fiber network.

In view of these applications, an ideal tunable laser shall have the following properties: wide tunable range covering C band and/or L band(approximately 1520 nanometers to 1620 nanometers), small size, fast tuning speed (sub-millisecond level) between the frequency intervals of any two international Telecommunication Unions (ITU) grid, excellent long-term working stability (service time over 25 years), high reliability under extreme environmental conditions, low power consumption and easy manufacturing and low cost.

With the successful development of Dense Wavelength Division Multiplexers (DWDM) and other high spectrum density related devices, the modern optical DWDM system has been developed with a frequency interval of 100 GHz, 50 GHz or 25 GHz and even higher density from the previous system with a frequency interval of 400 GHz and 200 GHz, Meanwhile, the transmission rate of an optical communication system has been increased to 10 Gbps, 40 Gbps or 100 Gbps from 2.5 Gbps in the past. This resulted in corresponding requirements on the small-size tunable laser for the optical communication system, and in particular, the stringent requirement on the optical frequency tuning interval and bandwidth of the tunable laser output. An external cavity tunable laser with high finesse etalons can reach the aforementioned requirements and accordingly becomes a good option for the new generation dynamic fiber optical communication system with high transmission rate and high spectrum density.

In an external cavity tunable laser, especially the lasers for fiber optical communication, the use of a high finesse etalon and a tunable narrow band optical filter will help to compress the laser output bandwidth and regulate the optical frequency tuning interval. If the frequency interval of laser output light is required to be $\Delta f$, the filtering bandwidth of the optical filter shall not exceed twice of this frequency interval, i.e. $<2\Delta f$, to avoid the laser working in a multi-mode state and therefore improve the working stability of the laser. If the frequency interval of laser output is required to be 50 GHz, the filtering bandwidth of the optical filter shall be less than 100 GHz; if the frequency interval of laser output light is required to be 25 GHz, the filtering bandwidth of the optical filter shall be less than 50 GHz. An optical filter such as a conventional optical grating filter or an acousto-optic filter with narrow bandwidth means higher manufacturing difficulty and higher cost, similarly, an etalon with narrow transmission spectrum interval means larger size, high manufacturing difficulty and cost.

DETAILED DESCRIPTION OF THE INVENTION

Figure 1:
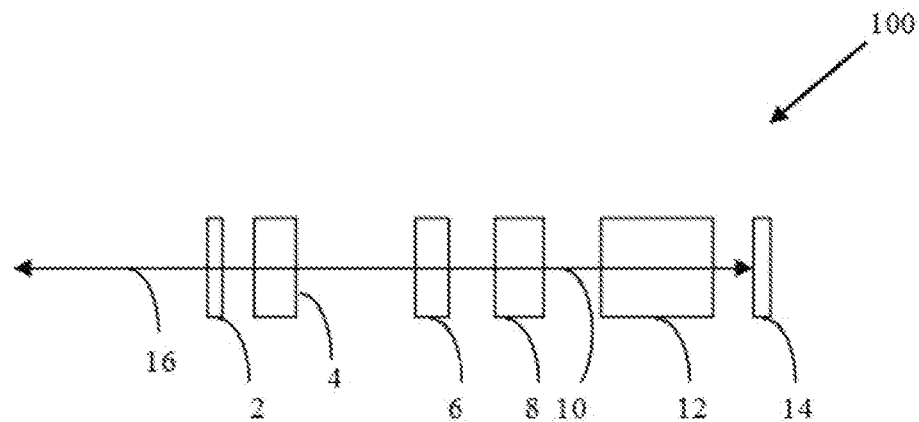
FIG. 1 is a schematic diagram of an existing external cavity tunable laser with no collimating lens.

It is an objective of the invention to overcome the shortcomings in the prior art and to provide a tunable laser with low cost, small size, easy manufacturing and high performance.

The technical scheme below is adopted by the invention for solving the technical problems in the prior art.

An external cavity tunable laser, comprising an extracavity collimating lens arranged outside the laser cavity, and a laser output mirror, a laser gain medium, an intracavity collimating lens, an active optical phase modulator and a tunable optical filter all arranged sequentially inside the laser cavity, the laser further comprises:

an active polarization rotator arranged behind the tunable optical filter for rotating the polarization direction of incident linearly polarized light by 90 degrees, a polarization beam splitter arranged behind the active polarization rotator with total transmission for incident parallel polarized light and reflecting incident vertically polarized light into a direction having an angle of 90 degrees with respect to the incident light, a first etalon and a first total reflection mirror, which are arranged sequentially in the direction vertical to the optic axis of the laser output mirror and used for receiving the vertically polarized light output by the polarization beam splitter and outputting the vertically polarized light to the first total reflection mirror; the first total reflection mirror and the laser output mirror forming a first laser resonant sub-cavity, a second etalon and a second total reflection mirror, which are arranged sequentially in the optic axis direction of the laser cavity output lens and used for receiving the parallel polarized light output by the polarization beam splitter and outputting the parallel polarized light to the second total reflection mirror; the second total reflection mirror and the laser output mirror forming a second laser resonant sub-cavity, a laser gain medium pumping device, an active phase modulator drive device, a tunable optical filter drive device, an active polarization rotator drive device and a laser drive control circuit.

Further, the first etalon and the second etalon have the same finesse.

Further, the first etalon and the second etalon have the same spectrum range as the laser gain medium, the transmission spectrum peak interval of the second etalon is the same as that of the first etalon, and the difference between the transmission spectrum peak frequency of the first and second etalon is the half of the transmission spectrum peak interval of the first or the second etalon.

Further, the laser output mirror, the first total reflection mirror and the second total reflection mirror are one of the following types: plane mirror or convex mirror or concave mirror; and the laser output mirror, and have the same spectrum range as the laser gain medium.

Further, the tunable optical filter is a tunable acousto-optic filter, or a tunable holographic grating filter, or a tunable optical filter comprising a conventional reflection or transmission grating and an electromechanical rotation device, or a combination of these aforementioned tunable optical filters.

Further, the tunable optical filter is a narrowband optical filter that has the same spectrum range as the laser gain medium and has a spectral FWHM not more than twice the transmission spectrum peak frequency of the first etalon or the second etalon.

Further, the active phase modulator is: an electro-optic phase modulator, or a magneto-optic phase modulator, or a liquid crystal phase modulator, or an acousto-optic phase modulator, or phase modulators based on other forms of physical optical effect, or a combination of the aforementioned phase modulators, and has the same spectrum range as the laser gain medium.

Further, the active polarization rotator is one of the following types: an electro-optic active polarization rotator, or a magneto-optic active polarization rotator, or a liquid crystal active polarization rotator, or an acousto-optic active polarization rotator, or active polarization rotators based on other forms of physical optical effect, or a combination of the aforementioned active polarization rotators, and has the same spectrum range as the laser gain medium.

Further, the laser output mirror has a reflectivity within a range from 5% to 95%.

Further, the laser drive control circuit comprises: a digital signal processor, four digital-to-analog conversion modules, the digital signal processor is used for receiving an external instruction signal and controlling the laser gain medium pumping device, the active phase modulator drive device, the tunable acousto-optic filter drive device and the active polarization rotator drive device.

The invention has the advantages and positive effects that: In this invention, an active polarization rotator, a polarization beam splitter, two etalons and two total reflection mirrors are used to form two laser resonant sub-cavities to achieve high spectrum density, narrow-frequency bandwidth within a wide spectrum range. The requirement on the filtering bandwidth of the optical filter is reduced by half for the same output properties with a single cavity laser. Stable laser output with 25 GHz frequency interval is realized by an optical filter with 50 GHz frequency interval, and the etalons having a 50 GHz transmission spectrum peak interval. Both the requirement on the filtering bandwidth of the tunable optical filter and the requirement on the transmission spectrum peak frequency interval of the etalons are reduced. And furthermore, the difficulty in manufacturing the tunable optical filter and the etalons is dramatically reduced. The external cavity tunable laser in this invention is compact with high performance and low cost for volume production and easy installation, achieves high spectral density, narrow spectral bandwidth and tunable stable laser output within a wide spectrum range, and significantly reduces the difficulty in manufacturing the tunable optical filter and the etalons.

Further detailed description is made below to the embodiments of the invention with reference to the drawings.

As shown in FIG. 1, an existing external cavity tunable laser 100 comprises a partial reflection mirror 2, a gain medium 4, an active optical phase modulator 6, a tunable filter 8, an etalon 12 and a total reflection mirror 14. The laser cavity is formed by the laser output mirror 2 with partial reflectivity (reflectivity is less than 100%), and the total reflection mirror 14 (100% reflectivity). The laser output mirror 2 typically differs in reflectivity for light with different wavelengths or colors, and the reflectivity mentioned herein means a reflectivity corresponding to the wavelength bandwidth of the external cavity tunable laser 100. The objective of the partial reflection mirror is to provide so-called 'positive feedback' for a laser system. No collimating lens is used in the cavity of the tunable laser 100, and use of such a cavity is normally based upon the fact that the laser gain medium is gas, liquid or some solid state gain media, In the tunable laser 100, the non-planar output mirror 2 and the total reflection mirror 14 are commonly used to obtain proper distribution of intracavity light beams. Laser optical frequency tuning is achieved via the active optical phase modulator 6 and the tunable filter 8. The interval of laser output spectrum is determined by the etalon 12. Use of an etalon with high finesse can compress the spectrum bandwidth of output light beam and increase the side mode suppression ratio. If the interval of laser output spectrum needs to be reduced, the filtering bandwidth of the tunable filter 8 and the free spectrum range (FSR) of the etalon 12 need to be reduced at the same time in order to eliminate the mode hopping and guarantee single-mode lasing oscillation. For example, if the frequency tuning interval of laser output spectrum needs to be 25 GHz, the FSR of the etalon 12 needs to be 25 GHz, and the FWHM (Full width half maximum) of the filtering bandwidth of the tunable filter 8 should be less than 50 GHz. This increases the technical difficulty and manufacturing cost of the tunable filter 8. The technical difficulty and manufacturing cost of the etalon 12 are also increased. If the laser gain medium is a homogeneous gain medium, it is generally required that the FWHM of the filtering bandwidth of the tunable optical filter is less than 2Δf (assuming that the transmission bandwidth of the etalon is Δf). If the filtering bandwidth of the tunable optical filter is more than 2Δf, multi-mode oscillation may occur, which results in multi-mode output or mode hopping phenomenon. If the laser gain medium is a non-homogeneous gain medium, the requirement of FWHM of the filtering bandwidth of the tunable filter is even narrower.

Figure 2:
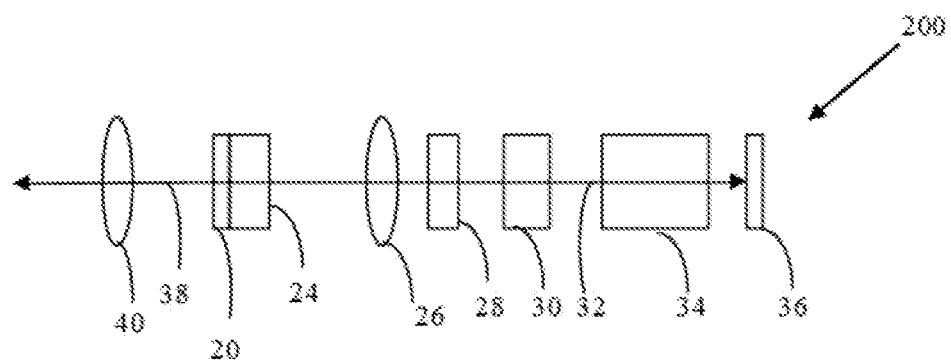
FIG. 2 is a schematic diagram of an existing external cavity tunable laser with collimating lenses.

When the laser gain medium is a semiconductor gain medium that has a relatively large output diverging angle, a tunable laser 200 as shown in FIG. 2 may be used. The tunable laser 200 comprises an extracavity collimating lens 40, an intracavity collimating lens 26, a laser gain medium 24, a reflective thin film mirror 20 directly plated on the laser gain medium, an active optical phase modulator 28, a tunable optical filter 30, an etalon 34 and a total reflection mirror 36. In the tunable laser 200, the intracavity collimating lens 26 is needed to collimate the output light beam. The reflective thin film mirror 20, which is directly plated on the laser gain medium, can replace the output reflection mirror in the tunable laser 100. Besides, the extracavity collimating lens 40 is needed to collimate the laser output light beam 38. For example, when such lasers are used for fiber optical communication, the output light beam 38 needs to be coupled to an optical fiber. The collimating lens 40 is indispensable for such an application. The working principle of the tunable laser 200 is the same as that of the tunable laser 100.

Figure 3:
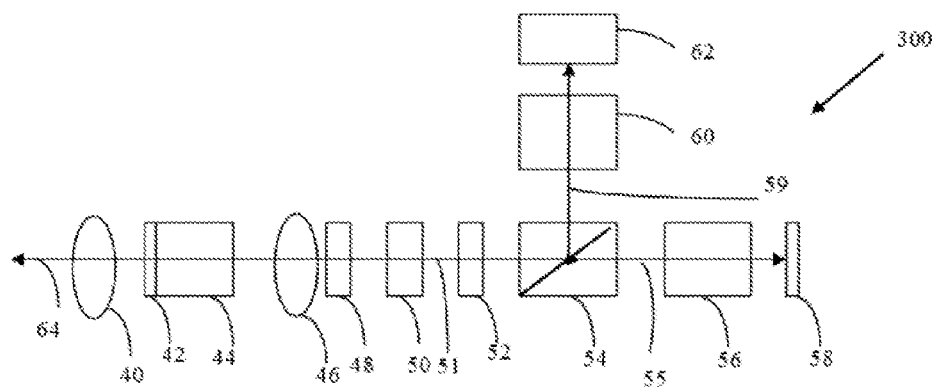
FIG. 3 is a schematic diagram of the invention.
Figure 4:
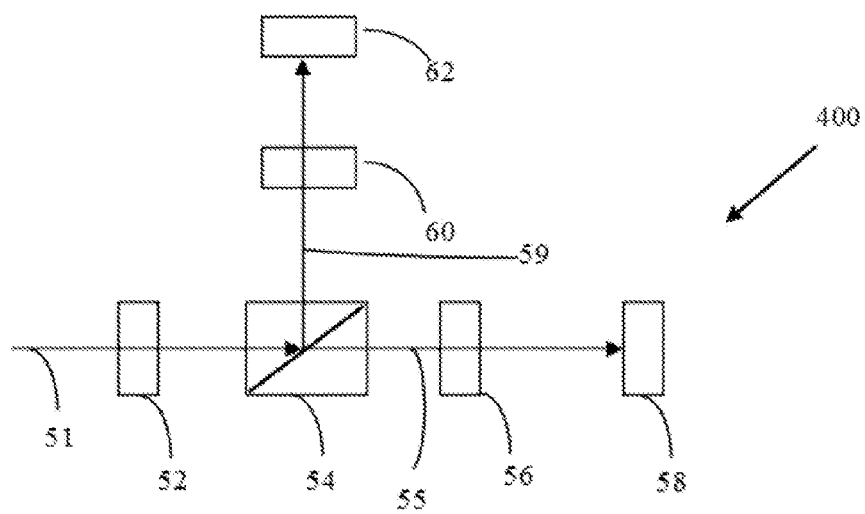
FIG. 4 is a schematic diagram of the device for laser resonant mode switching by an active polarization rotator and a polarization beam splitter.
Figure 5:
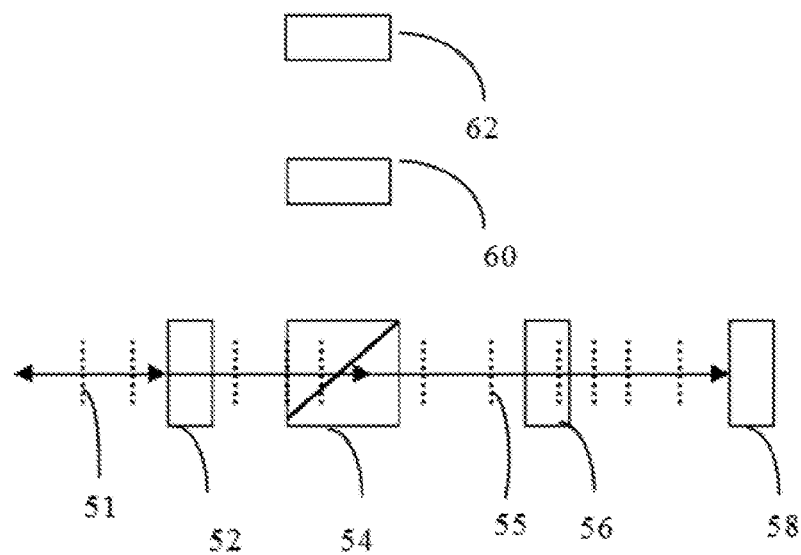
FIG. 5 is a schematic diagram illustrating the transmission path of the parallel polarized light in the device depicted in FIG. 4.
Figure 6:
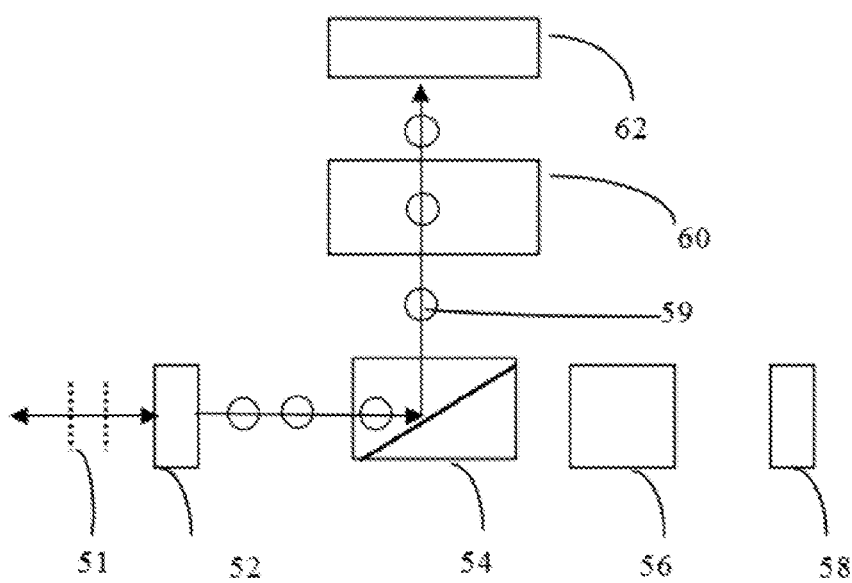
FIG. 6 is a schematic diagram illustrating the transmission path of vertically polarized light in the device depicted in FIG. 4.
Figure 7:
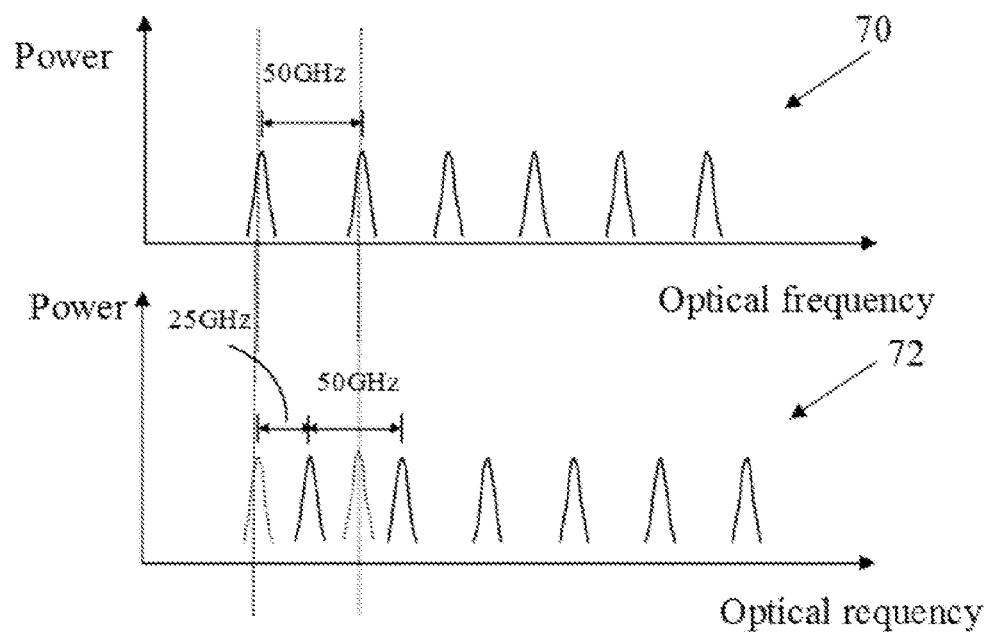
FIG. 7 is a schematic diagram of the transmission spectrums of the first etalon and the second etalon, wherein the upper portion shows the transmission spectrum of the first etalon with 50 GHz interval, the lower portion shows the transmission spectrum of the second etalon with 50 GHz interval and 25 GHz difference in transmission frequency peak.

Detailed description is made below to the external cavity tunable laser 300 of the invention. As shown in FIG. 3, the tunable laser 300 comprises an extracavity collimating lens 40, an intracavity collimating lens 46, a laser gain medium 44, a reflective thin film mirror 42 plated on the laser gain medium, an active optical phase modulator 48, a tunable optical filter 50, an active polarization rotator 52, a polarization beam splitter 54, a first etalon 56, a first total reflection mirror 58, a second etalon 60, a second total reflection mirror 62, a laser gain medium pumping device, an active phase modulator drive device, a tunable optical filter drive device, an active polarization rotator drive device and a laser drive control circuit. The extracavity collimating lens is arranged outside the laser cavity; the laser output mirror 42, the laser gain medium 44, the intracavity collimating lens 46, the active optical phase modulator 48 and the tunable optical filter 50 are all arranged sequentially inside the laser cavity. The active polarization rotator 52 is arranged behind the tunable optical filter 50 for rotating the polarization direction of incident linearly polarized light by 90 degrees. The polarization beam splitter 54 is arranged behind the active polarization rotator for total transmission of incident parallel polarized light and total reflection of incident vertically polarized light into a direction having an angle of 90 degrees with respect to the incident light. The first etalon 56 and the first total reflection mirror 58 are arranged in the direction vertical to the optical axis of the laser cavity output mirror and used for receiving the vertically polarized light output by the polarization beam splitter and outputting the vertically polarized light to the first total reflection mirror 58. The first total reflection mirror 58 and the laser output mirror 42 form a first laser resonant sub-cavity. The second etalon and the second total reflection mirror 62 are arranged in the optic axis direction of the laser cavity output mirror 42 and used for receiving the parallel polarized light output by the polarization beam splitter and outputting the parallel polarized light to the second total reflection mirror 62. The second total reflection mirror 62 and the laser output mirror 42 form a second laser resonant sub-cavity. The difference between the wavelength tunable laser 300 and the tunable laser 200 is that: the etalon 34 and the total reflection mirror 36 in the tunable laser 200 are replaced by a dual-light path system 400 consisting of the active polarization rotator 52, the polarization beam splitter 54, the first etalon 56, the first total reflection mirror 58, the second etalon 60 and the second total reflection mirror 62, as shown in FIG. 4. The active polarization rotator 52 can rotate the polarization direction of incident light 51. When the active polarization rotator 52 does not work, the incident light 51 directly passes through the polarization beam splitter 54, then arrives at the total reflection mirror 58 through the second etalon 56, and is finally reflected back into the laser cavity by the total reflection mirror 58, as shown in FIG. 5. When the active polarization rotator 52 is activated, the incident light 51 becomes vertically polarized light after the polarization state is rotated by 90 degrees, which is reflected by the polarization beam splitter 54, then arrives at the total reflection mirror 62 through the first etalon 60 and is finally reflected back into the laser cavity by the total reflection mirror 62, as shown in FIG. 6. The light reflected back by the total reflection mirror 62 passes through the active polarization rotator 52 again with its polarization state rotated by 90 degrees once again. As a result, the polarization direction of the output light beam of the laser is not changed.

Figure 8:
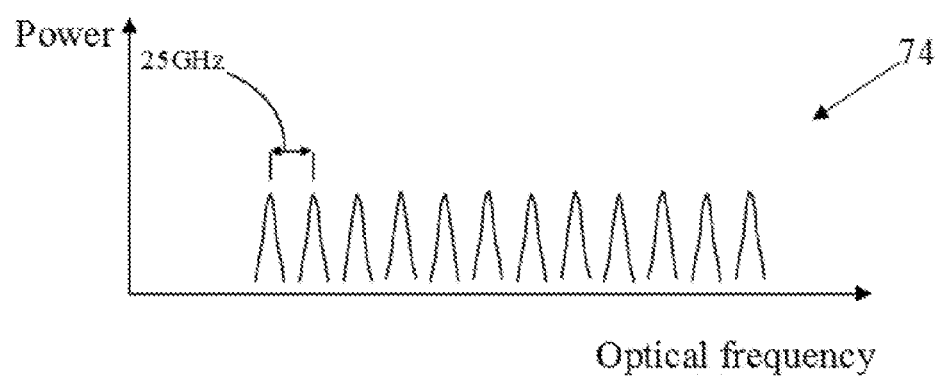
FIG. 8 is a schematic diagram of the output spectrum of the tunable laser with 25 GHz transmission spectrum interval.
Figure 9:
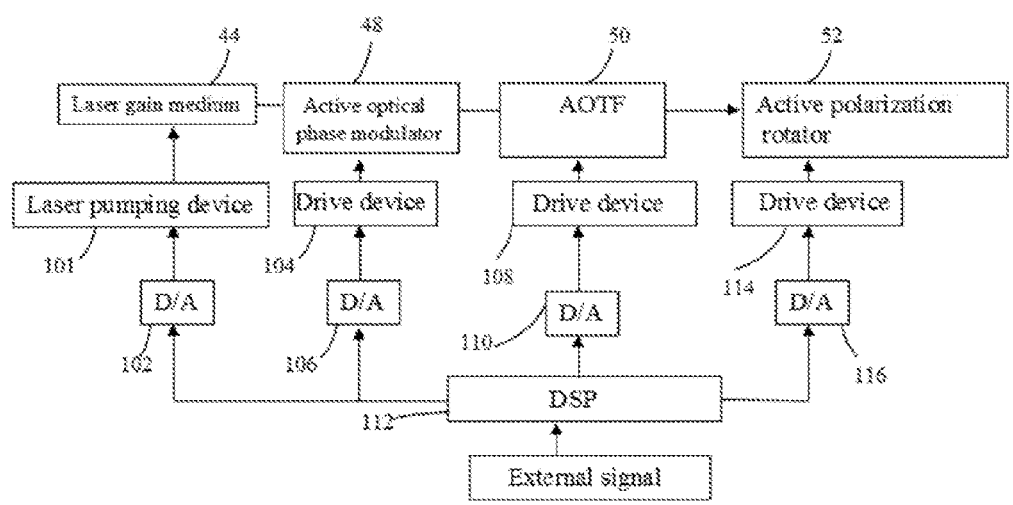
FIG. 9 is a functional block diagram of the laser drive control circuit of the invention.

Therefore, two laser sub-cavities can be formed in the wavelength tunable laser 300 depicted in FIG. 3 by controlling the active polarization rotator 52. No other device is needed in the laser cavity. FIG. 8 shows the transmission spectra of the etalon 56 as line 70 and the etalon 60 as line 72. The two etalons 56 and 60 have the same FSR of 50 GHz and finesse, but there is a 25 GHz difference between their transmission spectrum peaks. In this manner, the output spectrum of the tunable laser 300 is an integration of the two sub-cavities. Therefore, the tunable laser output with 25 GHz spectrum peak interval and consistent polarization states can be realized, as shown in FIG. 9.

In the invention, the first etalon 56 and the second etalon 60 have the same finesse and FSR. And same spectrum range as the laser gain medium 44 and the difference between the transmission spectrum peak frequency of the second etalon and the transmission spectrum peak frequency of the first etalon is equal to half of the FSR of either etalons. For example, the FSR of the first etalon 56 and second etalon 60 may be 50 GHz, 25 GHz or 12.5 GHz, its transmission spectrum peak frequency meets the international optical communication standards (ITU-GRID), and the difference between the transmission spectrum peak frequency of the second etalon 56 and the first etalon 60 is a half of the FSR of the either etalons, then the differences between the transmission spectrum peak frequency of the second etalon 60 and the transmission spectrum peak frequency of the first etalon 56 are 25 GHz, 12.5 GHz and 6.25 GHz respectively.

In general, fluorescent light output by a semiconductor laser gain medium is linearly polarized light. For such laser gain media, a polarizer is not needed in the cavity. As for other laser gain media with nonlinearly polarized light output, a polarizer is indispensable for the tunable laser 300 to achieve the above functions.

With the development of optical communication technology, DWDM optical communication network has been developed towards 25 GHz and even higher optical channel density. This requires a tunable optical filter with narrower filtering bandwidth, which increases the difficulty in manufacturing such a tunable optical filter and hence a tunable laser. The cost to build such a laser will also increase. As for other applications of such a tunable laser, the requirement for higher tunable spectrum density will increase the cost and technical difficulty. Therefore, the tunable laser 300, on the basis of the existing external cavity laser with 50 GHz frequency interval, can provide a simple method capable of achieving 25 GHz frequency interval, and the cost and manufacturing difficulty are not increased significantly.

A laser drive control circuit to control the laser gain medium pumping device, the active phase modulator drive device, the tunable filter drive device and the active polarization rotator drive device as shown in FIG. 9. The laser drive control circuit comprises a digital signal processor (DSP) 112 with embedded software programs, four digital-to-analog conversion (D/A) devices 102, 106, 110 and 116. The digital signal processor (DSP) 112 with embedded software programs is used for controlling the laser pumping device 101, the active optical phase modulator drive device 104, the tunable filter drive device 108 and the active polarization rotator drive device 114 respectively through the digital-to-analog conversion (D/A) devices 102, 106, 110 and 116. The digital signal processor 112 may also receive an external instruction to control the laser.

The above description is for demonstration and description only, not a detailed one without omission, and is not intended to limit the invention within the described specific forms. With the aforementioned description, many modifications and variations to the invention are possible, The chosen embodiments are merely for better explanation of the principle and practical applications of the invention. This description enables people familiar with this art to make better use of the invention, and to design different embodiments based on the actual needs and implement corresponding modifications.

What is claimed is:

1. An external cavity tunable laser, comprising an extra-cavity collimating lens arranged outside the laser cavity, and a laser output mirror, a laser gain medium, an intracavity collimating lens, an active optical phase modulator and a tunable optical filter all arranged sequentially inside the laser cavity, the laser further comprises:

an active polarization rotator arranged behind the tunable optical filter for rotating the polarization direction of incident linearly polarized light by 90 degrees, a polarization beam splitter arranged behind the active polarization rotator with total transmission for incident parallel polarized light and reflecting incident vertically polarized light into a direction having an angle of 90 degrees with respect to the incident light, a first etalon and a first total reflection mirror, which are arranged sequentially in the direction vertical to the optic axis of the laser output mirror and used for receiving the vertically polarized light output by the polarization beam splitter and outputting the vertically polarized light to the first total reflection mirror; the first total reflection mirror and the laser output mirror forming a first laser resonant sub-cavity, a second etalon and a second total reflection mirror, which are arranged sequentially in the optic axis direction of a laser cavity output lens and used for receiving the parallel polarized light output by the polarization beam splitter and outputting the parallel polarized light to the second total reflection mirror; the second total reflection mirror and the laser output mirror forming a second laser resonant sub-cavity, and a laser gain medium pumping device, an active phase modulator drive device, a tunable optical filter drive device, an active polarization rotator drive device and a laser drive control circuit.

2. The external cavity tunable laser of claim 1, wherein the first etalon and the second etalon have the same finesse.

3. The external cavity tunable laser of claim 2, wherein the first etalon and the second etalon have the same spectrum range as the laser gain medium, the transmission spectrum peak interval of the second etalon is the same as that of the first etalon, and the difference between the transmission spectrum peak frequency of the first and second etalon is the half of the transmission spectrum peak interval of the first or the second etalon.

4. The external cavity tunable laser of claim 1, wherein the first etalon and the second etalon have the same spectrum range as the laser gain medium, the transmission spectrum peak interval of the second etalon is the same as that of the first etalon, and the difference between the transmission spectrum peak frequency of the first and second etalon is the half of the transmission spectrum peak interval of the first or the second etalon.

5. The external cavity tunable laser of claim 1, wherein the laser output mirror, the first total reflection mirror and the second total reflection mirror are one of the following types: plane mirror or convex mirror or concave mirror; and the laser output mirror, and have the same spectrum range as the laser gain medium.

6. The external cavity tunable laser of claim 1, wherein the tunable optical filter is a tunable acousto-optic filter, or a tunable holographic grating filter, or a tunable optical filter comprising a conventional reflection or transmission grating and an electromechanical rotation device or a combination of these aforementioned tunable optical filters.

7. The external cavity tunable laser of claim 6, wherein the tunable optical filter is a narrowband optical filter that has the same spectrum range as the laser gain medium and has a spectral FWHM not more than twice the transmission spectrum peak frequency of the first etalon or the second etalon.

8. The external cavity tunable laser of claim 1, wherein the tunable optical filter is a narrowband optical filter that has the same spectrum range as the laser gain medium and has a spectral FWHM not more than twice the transmission spectrum peak frequency of the first etalon or the second etalon.

9. The external cavity tunable laser of claim 1, wherein the active phase modulator is: an electro-optic phase modulator, or a magneto-optic phase modulator, or a liquid crystal phase modulator, or an acousto-optic phase modulator, or phase modulators based on other forms of physical optical effect, or a combination of the aforementioned phase modulators, and has the same spectrum range as the laser gain medium.

10. The external cavity tunable laser of claim 1, wherein the active polarization rotator is one of the following types: an electro-optic active polarization rotator, or a magneto-optic active polarization rotator, or a liquid crystal active polarization rotator, or an acousto-optic active polarization rotator, or active polarization rotators based on other forms of physical optical effect, or a combination of the aforementioned active polarization rotators, and has the same spectrum range as the laser gain medium.

11. The external cavity tunable laser of claim 1, wherein the laser output mirror has a reflectivity within a range from 5% to 95%.

12. The external cavity tunable laser of claim 1, wherein the laser drive control circuit comprises: a digital signal processor, four digital-to-analog conversion modules, the digital signal processor is used for receiving an external instruction signal and controlling the laser gain medium pumping device, the active phase modulator drive device, the tunable acousto-optic filter drive device and the active polarization rotator drive device.

* * * * *